(12) United States Patent
Tanaka et al.

(10) Patent No.: US 10,347,809 B2
(45) Date of Patent: Jul. 9, 2019

(54) LIGHT-EMITTING DEVICE

(71) Applicant: TOYODA GOSEI CO., LTD., Kiyosu-shi (JP)

(72) Inventors: Motoyuki Tanaka, Kiyosu (JP); Yusuke Toyoda, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 6 days.

(21) Appl. No.: 15/691,590

(22) Filed: Aug. 30, 2017

(65) Prior Publication Data

US 2018/0083174 A1 Mar. 22, 2018

(30) Foreign Application Priority Data

Sep. 21, 2016 (JP) ................. 2016-184667

(51) Int. Cl.
| | |
|---|---|
| *H01L 33/64* | (2010.01) |
| *H01L 25/075* | (2006.01) |
| *H01L 33/48* | (2010.01) |
| *H01L 33/50* | (2010.01) |
| *H01L 33/60* | (2010.01) |
| *H01L 33/62* | (2010.01) |
| *G02F 1/13357* | (2006.01) |
| *H01L 33/32* | (2010.01) |

(52) U.S. Cl.
CPC ........ *H01L 33/647* (2013.01); *H01L 25/0753* (2013.01); *H01L 33/486* (2013.01); *H01L 33/502* (2013.01); *H01L 33/60* (2013.01); *H01L 33/62* (2013.01); *G02F 1/1336* (2013.01); *H01L 33/32* (2013.01)

(58) Field of Classification Search
CPC . H01L 33/647; H01L 25/0753; H01L 33/502; H01L 33/60; H01L 33/62; H01L 33/486; H01L 33/32; G02F 1/1336
See application file for complete search history.

(56) References Cited

U.S. PATENT DOCUMENTS

| | | | |
|---|---|---|---|
| 8,558,454 B2 * | 10/2013 | Kamijo | ........... H01L 33/62 |
| | | | 313/498 |
| 8,749,263 B2 | 6/2014 | Ohta et al. | |
| | (Continued) | | |

FOREIGN PATENT DOCUMENTS

| | | |
|---|---|---|
| JP | H 10-223817 A | 8/1998 |
| JP | 2012-049480 A | 3/2012 |
| JP | 2013-110210 A | 6/2013 |

*Primary Examiner* — Daniel Whalen
(74) *Attorney, Agent, or Firm* — McGinn IP Law Group, PLLC

(57) ABSTRACT

To suppress misalignment when a light-emitting element is mounted on a substrate. On the substrate of a light-emitting device, a through hole is formed passing through so as to notch the side surface of the substrate, and a side surface electrode is formed on the side surface of the through hole. The pattern of a front surface electrode has a first region, a second region being connected to the first region, and a third region being connected to the first region and the second region. The shape of the first region is a rectangle coinciding with the electrode of the light-emitting element, and the longitudinal direction of the rectangle is aligned with the longitudinal direction of the substrate. The second region is formed in a lid shape so as to cover the top of the through hole. The shape of the second region is a trapezoid.

7 Claims, 5 Drawing Sheets

(56) References Cited

U.S. PATENT DOCUMENTS

2010/0277919 A1* 11/2010 Okada ................ H01L 25/0753
 362/249.02
2015/0340550 A1* 11/2015 Ikegami ................ H01L 33/56
 438/27

* cited by examiner

LIGHT-EMITTING DEVICE

BACKGROUND OF THE INVENTION

Field of the Invention

The present invention relates to a light-emitting device mounted with a flip-chip type light-emitting element.

Background Art

A side-view type light-emitting device which emits light in a direction horizontal to a mounting surface has been used as a light source for a backlight of a liquid crystal display. Recently, thinning and downsizing of the side-view type light-emitting device are required due to an increasing demand for narrow frame and high luminance of the liquid crystal display. In order to fulfill such a demand, it has been studied to reduce the mounting area by employing a rectangular flip-chip type element as a light-emitting element.

Japanese Patent Application Laid-Open (kokai) No. 1998-223817 discloses a side-view type light-emitting device having quarter circular through holes so as to notch the corners of the light-emitting device, and having side surface electrodes on the side surfaces of the through holes.

Japanese Patent Application Laid-Open (kokai) No. 2012-49480 discloses a light-emitting device having a surface electrode being connected to the light-emitting element on the surface of a substrate, a rear surface electrode on the rear surface of the substrate, semicircular through holes so as to notch the sides of the substrate, and side surface electrodes connecting the surface electrode and the rear surface electrode on the side surfaces of the through holes.

Japanese Patent Application Laid-Open (kokai) No. 2013-110210 discloses a side-view type light-emitting device having a reflector on a substrate, wherein arc-shaped through holes passing through the substrate and the reflector are formed on the sides or corners of the substrate, and the side surfaces of the through holes are plated.

Since thinning and downsizing of the side-view type light-emitting device are required, high accuracy is required in mounting a flip-chip type light-emitting element on a substrate. However, the light-emitting element is rectangular. Misalignment in mounting largely affects the light distribution direction, particularly misalignment in a short side direction significantly affects the light distribution direction.

SUMMARY OF THE INVENTION

In view of the foregoing, an object of the present invention is to mount a rectangular light-emitting element while suppressing misalignment.

In one aspect of the present invention, there is provided a light-emitting device comprising:

a rectangular substrate;

a through hole being formed respectively at both sides of the substrate, and passing through the substrate;

a front surface electrode formed on a front surface of the substrate;

a rear surface electrode formed on a rear surface of the substrate;

a side surface electrode being formed on a side surface of the through hole, and connecting the front surface electrode and the rear surface electrode; and a flip-chip type light-emitting element being formed on a surface of the substrate, and being connected to the front surface electrode, wherein the light-emitting element is rectangular, two electrodes are separately formed each other on one main surface of the light-emitting element, and each of the electrodes has a long shape extending in a longitudinal direction of the rectangular light-emitting element;

wherein the through holes are formed so as to notch the long side of the substrate;

wherein the front surface electrodes are formed respectively at both sides of the substrate, each of the front surface electrodes has a first region having the same pattern as that of the long-shaped electrode of the light-emitting element or a pattern being extended in the longitudinal direction, and the longitudinal direction of the pattern being aligned with the longitudinal direction of the substrate; and a second region being connected to the first region, being formed in a lid shape so as to cover the top of the through hole, and having a shape where the width in the long side direction is increased toward the long side being notched by the through hole of the long sides of the substrate; and wherein the light-emitting elements are arranged and connected so that one electrode of the light-emitting element coincides in shape with the first region of the front surface electrode.

The front surface electrode may also have a third region disposed facing the second region with the first region between. This allows further suppression of misalignment in mounting the light-emitting element.

The second region may have any shape as long as the width in the long side direction is increased toward the long side on the through hole side of the long sides of the substrate. However, the second region preferably has a trapezoidal shape in terms of easy pattern processing, thereby easily improving the formation accuracy of the front surface electrode 12.

The through hole preferably has a similar reduced shape of the second region. Such a shape can reduce a distance from the side surface of the through hole to the outer periphery of the second region, the width of the through hole can be increased in the long side of the substrate, thereby improving the mounting strength when the light-emitting device is mounted on a mounting substrate.

According to the present invention, the length of the side with which the first region and the second region of the front surface electrode are in contact can be reduced, and the length of the side defined as the outer periphery of the front surface electrode of the long sides on the through hole side of the first region can be increased, thereby making the length closer to the length of the long side of the electrode of the light-emitting element. Therefore, misalignment can be suppressed when the light-emitting element is mounted at a position of the first region. Moreover, since the second region has a shape where the width in the long side direction is increased toward the through hole, the width of the through hole can be increased in the long side of the substrate, thereby sufficiently securing the mounting strength when the light-emitting device is mounted on the mounting substrate.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
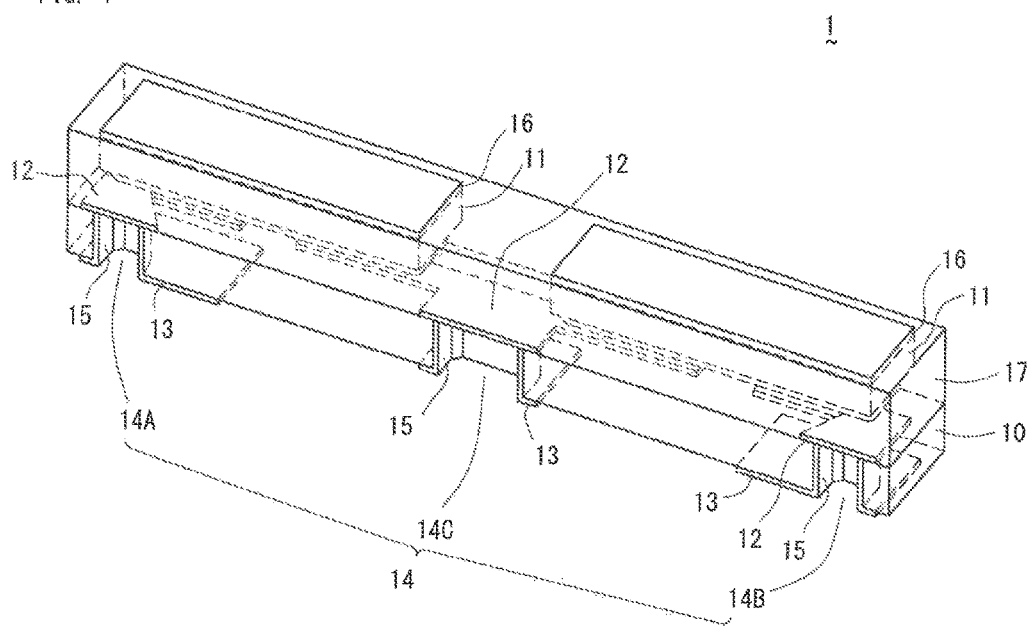
FIG. 1 is a sketch of a light-emitting device according to Embodiment 1 viewed from the obliquely upper side.
Figure 2:
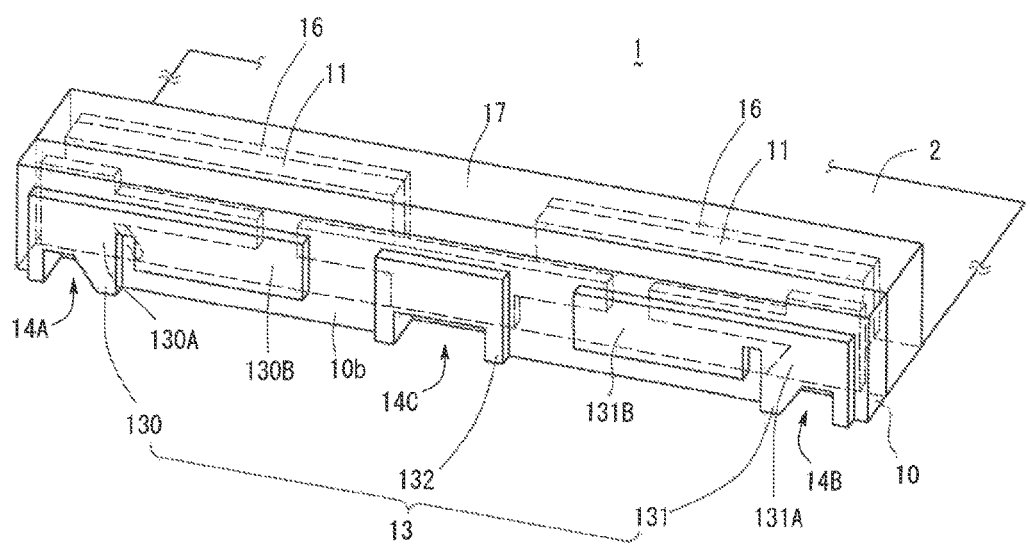
FIG. 2 is a sketch of the light-emitting device according to Embodiment 1 viewed from the rear side.
Figure 6:
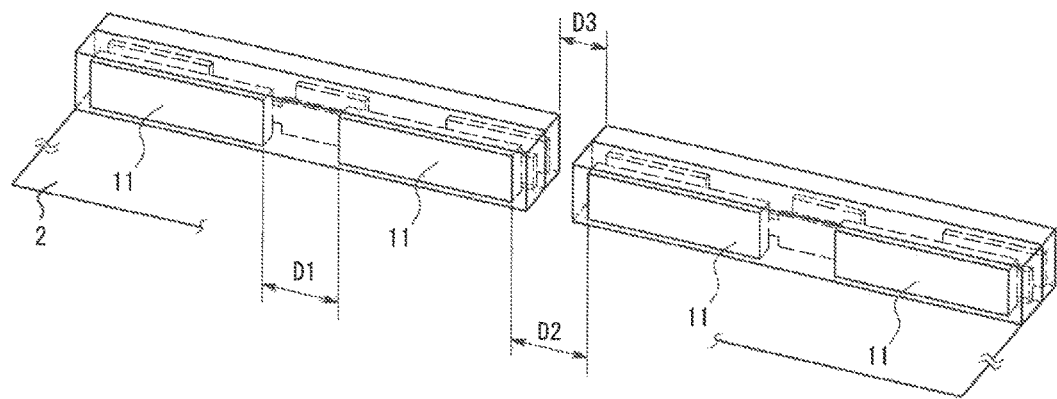
FIG. 6 is a sketch showing the state in which a plurality of light-emitting devices according to Embodiment 1 is mounted on a mounting substrate.

FIG. 1 shows the structure of a light-emitting device according to Embodiment 1. The light-emitting device 1 according to Embodiment 1 is a side-view type which emits white light in a direction horizontal to the mounting surface of a mounting substrate 2 as shown in FIG. 6. FIG. 1 shows the light-emitting device 1 according to Embodiment 1 having an upward light emitting direction, as viewed from the obliquely upper side. FIG. 2 is a sketch of the light-emitting device 1 according to Embodiment 1 viewed from the rear side.

Figure 3:
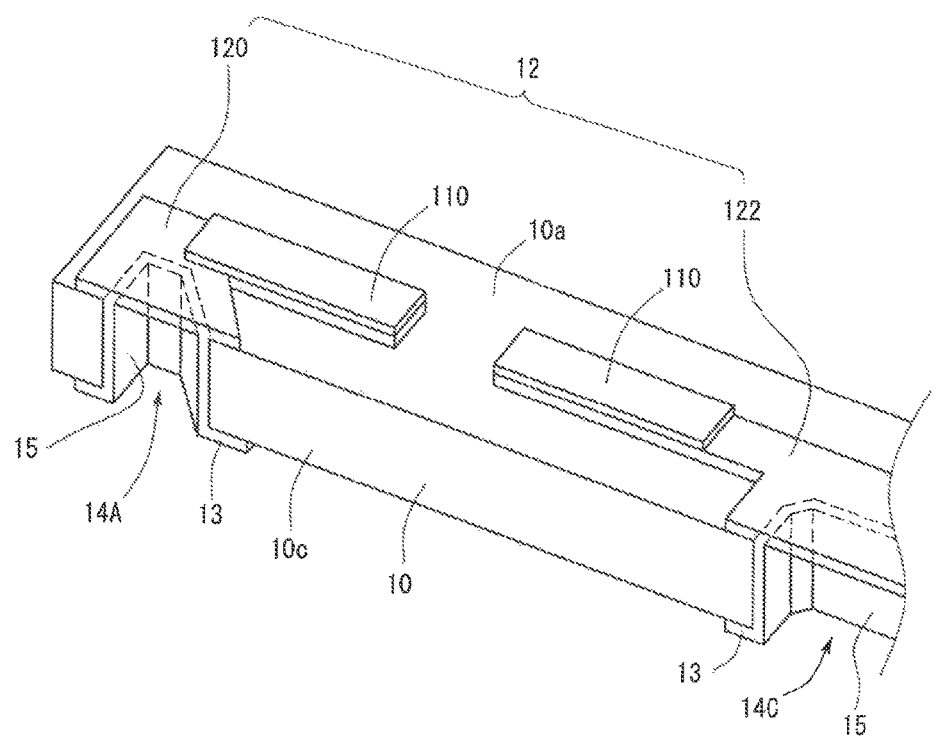
FIG. 3 is a sketch showing the position correspondence relationship between electrodes 110 of a light-emitting element 11 and a front surface electrode 12.
Figure 4:
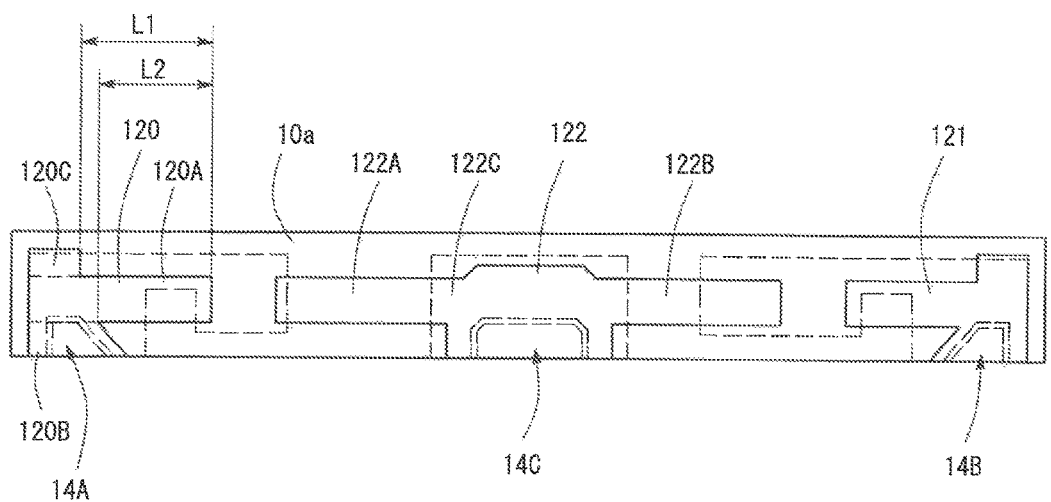
FIG. 4 is a sketch showing the patterns of the front surface electrode 12 and a through hole 14.

FIG. 3 is a sketch showing the position correspondence relationship between electrodes of a light-emitting element 11 being mounted and a front surface electrode 12. FIG. 4 is a sketch showing the patterns of the front surface electrode 12 and a through hole 14.

As shown in FIG. 1, the light-emitting device 1 according to Embodiment 1 has a substrate 10 and two light-emitting elements 11 mounted on the surface of the substrate 10. A front surface electrode 12 is formed on a top surface of the substrate 10, which is connected to electrodes of the light-emitting element 11. A rear surface electrode 13 is formed on a rear surface of the substrate 10. The substrate 10 has through holes 14 passing through so as to notch the side surface 10c of the substrate 10, and side surface electrodes 15 are formed on the side surfaces of the through holes 14 as shown in FIG. 3. Phosphor sheets 16 are formed on the surfaces of the light-emitting elements 11 and the side surfaces of the light-emitting elements 11 are covered with sealing resin 17. The side surface 10c of the substrate 10 is arranged on the mounting substrate 2 as shown in FIGS. 2 and 6. The wiring on the mounting substrate 2 and the side surface electrodes 15 are connected by the solder filled in the through holes 14.

The substrate 10 is a rectangular glass epoxy substrate. The front surface electrode 12 is formed on the front surface 10a of the substrate 10 (the surface on which the light-emitting element 11 is mounted), and the rear surface electrode 13 is formed on the rear surface 10b of the substrate 10 (the surface opposite to the surface on which the light-emitting element 11 is mounted). The front surface electrode 12 and the rear surface electrode 13 are connected via the side surface electrodes 15 formed on the side surfaces of the through holes 14. Two light-emitting elements 11 are disposed on the front surface 10a of the substrate 10, and the electrodes of the light-emitting elements 11 are connected to the front surface electrode 12 via solder (not illustrated).

Other than glass epoxy substrate, the substrate 10 may be a substrate obtained by impregnating a basic material of glass with silicone resin, bismaleimide-triazine resin, or fluorine-based resin.

The light-emitting element 11 is a blue light-emitting element made of Group III nitride semiconductor. The light-emitting element 11 is a flip-chip type having a structure in which an electrode pattern is formed on one surface, and light is extracted from the other surface opposite to the surface having the electrode pattern thereon. The shape of the light-emitting element 11 is a rectangle in a plan view, having a short side of 200 μm, a long side of 1,100 μm, and a ratio of long side to short side (aspect ratio) of 5.5.

The lengths of the long side and the short side of the light-emitting element 11 are not limited to the above. As long as the light-emitting element 11 has a rectangle shape, the aspect ratio of the rectangle is not specifically limited. When the aspect ratio is 2.5 or more, misalignment in mounting the light-emitting element is effectively suppressed in the present invention. In terms of uniform light emission or easy production, the aspect ratio is preferably 7.5 or less, more preferably, 4.0 to 7.0, and further preferably, 4.8 to 6.0.

Figure 5:
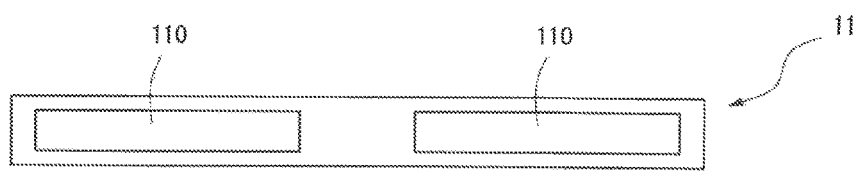
FIG. 5 is a sketch showing the pattern of the electrode of the light-emitting element 11.

As shown in FIG. 5, two electrodes 110 of the light-emitting element 11 are formed in a pattern where two rectangles are disposed apart from each other, and the longitudinal direction of the substrate 10 is aligned with the longitudinal direction of the electrodes 110. The rectangle of the electrode 110 has a short side of 130 μm, a long side of 415 μm, and a ratio of long side to short side (aspect ratio) of 3.2.

The electrodes 110 of the light-emitting element 11 do not necessarily have a rectangle. The electrodes 110 may have any shape as long as they have a long shape extending in the longitudinal direction of the light-emitting element, and may have different shapes to distinguish between anode and cathode. For example, two rectangles of the electrodes 110 may have different lengths in the longitudinal direction, and at least one of two rectangles of the electrodes 110 may have rounded corners. When the electrode 110 has a long shape with an aspect ratio of 1.6 or more, misalignment in mounting the light-emitting element 11 is effectively suppressed in the present invention. Therefore, in terms of shape limitation or easy production of the light-emitting element 11, the aspect ratio is preferably 6.5 or less, more preferably, 2.4 to 4.0, and further preferably, 3.0 to 3.6. The length of the electrode 110 in the longitudinal direction is preferably ¼ or less of the length of the long side of the light-emitting element 11. This can further suppress misalignment in mounting the light-emitting element 11.

Two light-emitting elements 11 are disposed in a line in the longitudinal direction of the substrate 10. The longitudinal direction of the light-emitting element 11 is aligned with the longitudinal direction of the substrate 10. In such an arrangement, the electrodes 110 of each light-emitting element 11 are connected via solder to the front surface electrode 12 on the front surface of the substrate 10. Two light-emitting elements 11 are connected in series by the front surface electrode 12.

The top surface of the light-emitting element 11 (the light extraction surface) is laminated with a phosphor sheet 16. The phosphor sheet 16 is a rectangular sheet having the same shape as the light-emitting element 11, and being made by mixing green phosphor and red phosphor with resin. The phosphor sheet 16 converts a part of blue light emitted from the light-emitting element 11 into green light or red light, and mixes them with blue light into white light.

The side surfaces of the light-emitting element 11 and the phosphor sheet 16 are covered with a sealing resin 17. The sealing resin 17 physically and chemically protects the light-emitting element 11. The sealing resin 17 reflects light emitted from the light-emitting element 11 to efficiently mix the colors of light. The sealing resin 17 is silicone resin. In addition, epoxy resin or acrylic resin may be used. Inorganic material such as glass may be used. The sealing resin 17 may be added with a light diffusing agent for diffusing light by reflection. The light diffusing agent is particles such as $TiO_2$ and $SiO_2$.

The front surface electrode 12 is formed on the front surface 10a of the substrate 10. As shown in FIGS. 1 to 4, the front surface electrode 12 comprises patterns 120 and 121 being connected to the outside via the rear surface electrode 13, and a pattern 122 connecting in series between two light-emitting elements 11. The patterns 120 and 121 are disposed respectively at both sides of the substrate 10, and the pattern 122 connecting in series is disposed at the center of the substrate 10.

The patterns 120 and 121 are symmetrical to a line which is in parallel with the short side direction of the substrate 10 and passes through the center of the substrate 10, that is, have the same shape by mirror reversing. Next will be described only the details of the pattern 120, and a description of the pattern 121 is omitted.

As shown in FIG. 4, the pattern 120 has a first region 120A, a second region 120B being connected to the first region 120A, and a third region 120C being connected to the first region 120A and the second region 120B.

The first region 120A is a region being connected to the electrodes 110 of the light-emitting element 11 via solder. The shape of the first region 120A is a rectangle having a short side of the same length as that of the electrode 110 of the light-emitting element 11 and a long side of a length longer than that of the electrode 110. The longitudinal direction of the rectangle is aligned with the longitudinal direction of the substrate 10. The length of the short side of the first region 120A is not necessarily the same as the length of the short side of the electrode 110. Taking manufacturing error into consideration, errors of plus or minus 10% is allowable. As long as the length of the long side of the first region 120A is equal to or longer than the length of the long side of the electrode 110, the length in the longitudinal direction of the first region 120A may be the same as the length in the longitudinal direction of the electrode 110. However, to bring the light-emitting element 11 closer to the short side of the substrate 10, the length of the long side of the first region 120A is preferably 1.5 times or less the length of the long side of the electrode 110, more preferably, 1.25 times or less, and further preferably, 1.1 times or less.

The second region 120B is a region being connected to the rear surface electrode 13 via the side surface electrode 15. The second region 120B is formed in a lid shape so as to cover the top of the through hole 14. The shape of the second region 120B is a trapezoid as shown in FIGS. 3 and 4. One of two parallel sides of the trapezoid is on the same straight line of the long side of the substrate 10, and the other is connected to the long side on the through hole side of the first region 120A. Of two bottom angles, the bottom angle on the short side of the substrate 10 is 90°, and the bottom angle on the center side of the substrate 10 is 45°. The bottom angle on the short side of the substrate 10 is not necessarily 90°. However, the bottom angle on the short side of the substrate 10 is preferably 90°, and a side perpendicular to two parallel sides of the trapezoid is preferably in parallel with the short side of the substrate 10. Thereby, the light-emitting element 11 can be mounted closer to the short side of the substrate 10, and misalignment in mounting the light-emitting element 11 can be further suppressed. Particularly, the length in the longitudinal direction of the region connecting the first region 120A and the second region 120B is reduced, thereby further suppressing the misalignment due to rotation of the light-emitting element 11 in the short side direction. Moreover, the bottom angle on the center side of the substrate 10 is not necessarily 45°. However, to sufficiently secure the mounting strength when the light-emitting device 1 is actually mounted on the mounting substrate 2, the bottom angle on the center side of the substrate 10 is preferably 70° or less, more preferably, 60° or less. The bottom angle is preferably 30° or more in terms of the pattern formation accuracy of the second region 120B.

The following effects can be obtained by forming the second region 120B to a shape where the width in the longitudinal direction is increased toward the long side on the through hole 14 side of the substrate 10.

Firstly, the length of the side with which the first region 120A and the second region 120B are in contact can be reduced. Of the long sides on the through hole 14A side of the first region 120A, length L2 of the side that is not contact with the second region 120B and is defined as the outer periphery of the pattern 120 is increased, thereby making the length L2 closer to the length of the long side of the electrode of the light-emitting element 11. A region where the end opposite to the short side of the substrate 10 of the first region 120A coincides in shape with the end of the electrode 110 of the light-emitting element 11 is increased, and the ends easily coincide with each other. Alignment between the electrode 110 of the light-emitting element 11 and the first region 120A is facilitated, and misalignment can be suppressed in mounting the light-emitting element 11. The length L2 is preferably 0.6 times or more the length of the long side of the electrode 110 of the light-emitting element 11, more preferably, 0.8 times, and further preferably, 1.0 times.

Secondly, since the width of the second region 120B is increased in the long side of the substrate 10, a larger junction area can be obtained when the light-emitting device 1 according to Embodiment 1 is actually mounted on the mounting substrate 2. As a result, the mounting strength can be sufficiently secured.

Thirdly, the second region 120B is formed so as to put a lid on the opening of the through hole 14A, and the length of the side with which the first region 120A and the second region 120B are in contact is reduced, thereby bringing the through hole 14A closer to the short side of the substrate 10.

These effects have advantages when a plurality of light-emitting devices according to Embodiment 1 are mounted in a line on the mounting substrate 2 and used as a linear light source for a backlight of a liquid crystal display. In the liquid crystal display, the linear light source needs to achieve high brightness and less brightness unevenness. For that, as shown in FIG. 6, a distance D1 between the adjacent light-emitting elements 11 in the light-emitting device and a distance D2 between the light-emitting elements 11 of the adjacent light-emitting devices are matched, and the distances D1 and D2 are preferably further reduced. Since the distance D1 can be sufficiently reduced by the current techniques, the distance D2 needs to be reduced. However, in the conventional side-view type light-emitting device, solder overflows in the longitudinal direction of the light-emitting device in mounting. Therefore, it was difficult to reduce a distance D3 between the light-emitting devices (a distance between the short sides of the substrate 10 of the adjacent light-emitting devices).

On the other hand, in the light-emitting device 1 according to Embodiment 1, the through hole 14A is formed so as to notch only the long side of the substrate 10. Solder does not overflow from the through hole 14A when the light-emitting device 1 is mounted so that solder does not spread and overflow in the longitudinal direction of the light-emitting device 1. Thus, the distance D3 between the light-emitting devices 1 can be reduced, and the distance D2 can also be reduced. Moreover, since the end opposite to the short side of the substrate 10 of the first region 120A is easy to coincide with the end of the electrode 110 of the light-emitting element 11, misalignment in a direction where the light-emitting elements 11 come closer to each other is suppressed. As a result, variation in D1 and D2 can be suppressed when D1 and D2 are matched.

The third region 120C is disposed facing the second region 120B with the first region 120A between, and is connected to the first region 120A. The third region 120C has a rectangular shape. The third region 120C is formed to suppress misalignment due to rotation of the light-emitting element 11 when it is mounted on the surface of the substrate 10.

The reason that misalignment of the light-emitting element 11 is suppressed by the third region 120C will be described in details. When the light-emitting element 11 is mounted on the substrate 10, the electrode 110 of the light-emitting element 11 is junctioned to the first region 120A by forming solder on the first region 120A, positioning so that the electrode 110 of the light-emitting element 11 overlaps with the first region 120A, and melting solder by heat treatment. At this time, the molten solder flows from the first region 120A to the second region 120B. A force of rotating to the second region 120B side acts on the light-emitting element 11 by being dragged by the solder flow, resulting in misalignment of the light-emitting element 11 (particularly in the short side direction of the substrate 10). When there is a third region 120C, the molten solder flows not only to the second region 120B but to the third region 120C from the first region 120A. Therefore, a force of rotating to the third region 120C side is also applied to the light-emitting element 11. This force is reverse to the force of rotating the light-emitting element 11 to the second region 120B. As a result, the force of rotating the light-emitting element 11 is cancelled or the force of rotating the light-emitting element 11 is weakened even if not cancelled, thereby suppressing misalignment in mounting the light-emitting element 11.

The third region 120C may have any shape or size. The third region 120C is not necessarily formed, however, it is preferably formed to suppress misalignment as described above. The shape or size of the third region 120C is preferably set to satisfy the condition that a length L1 defined as the outer periphery of the pattern 120 without being connected to the third region 120C of the long sides on the side opposite to the through hole 14 side of the first region 120A coincides with the long side of the electrode 110 of the light-emitting element 11. Setting the shape or size in such a way allows further suppression of misalignment of the light-emitting element 11.

Next will be described the pattern 122 of the front surface electrode 12. The pattern 122 of the front surface electrode 12 is an electrode pattern for connecting in series two light-emitting elements 11. The shape of the pattern 122 comprises a rectangular pattern 122C and elongated rectangular patterns 122A and 122B respectively connected to the both ends of the rectangular pattern 122C, as shown in FIG. 4. The length of the elongated rectangular pattern 122A or 122B is longer than the long side of the rectangular electrode 110 of the light-emitting element 11. The elongated rectangular pattern 122A and the electrode 110 (different from the electrode 110 connected to the first region 120A) of the light-emitting element 11 are connected via solder. The rectangular pattern 122C is a lid-shaped pattern to cover the top of the through hole 14C. The width of the rectangular pattern 122C is also elongated to the side opposite to the through hole 14C. That is, the rectangular pattern 122C has a region having the function same as that of the third region 120C.

The rear surface electrode 13 is formed on the rear surface of the substrate 10. The rear surface electrode 13 has patterns 130, 131, and 132 being connected to the mounting substrate 2 as shown in FIG. 2. The patterns 130 and 131 are respectively connected to the patterns 120 and 121 of the front surface electrode 12 via the side surface electrode 15. The pattern 132 is connected to the pattern 122 of the front surface electrode 12 via the side surface electrode 15.

The patterns 130 and 131 of the rear surface electrode 13 have rectangular patterns 130A and 131A formed at the ends of the substrate 10, respectively and elongated rectangular patterns 130B and 131B extending toward the center of the substrate 10 from the rectangular patterns 130A and 131A, respectively. The elongated rectangular patterns 130B and 131B are formed to improve heat radiation. One side of the rectangular pattern 130A or 131A is on the same straight line as the long side of the substrate 10, and other sides are spaced in parallel with the short side and the long side of the substrate 10. Each side of the elongated rectangular patterns 130B and 131B is spaced apart in parallel with the short side and the long side of the substrate 10. By providing each side of the rectangular patterns 130A and 131A or the elongated rectangular patterns 130B and 131B with such spacing, solder is prevented from spreading and overflowing when the light-emitting device 1 according to Embodiment 1 is actually mounted on the mounting substrate 2. Necked parts are formed at connecting parts between the rectangular patterns 130A and 131A and the elongated rectangular patterns 130B and 131B, respectively. The necked parts prevent solder from overflowing in the longitudinal direction of the light-emitting device 1. This makes it easier to form wall-like solder on the rear surface 10b of the light-emitting device 1, thereby improving the mounting strength.

The length of the long side of the elongated rectangular pattern 130B may be different from that of the elongated rectangular pattern 131B. This can easily distinguish between anode and cathode. The rectangular patterns 130A and 131A of the patterns 130 and 131 of the rear surface electrode 13 may be any shape, however, the shape is preferably rectangular as in Embodiment 1 to improve heat radiation by increasing the area.

The through hole 14 passes from the top surface to the rear surface of the substrate 10. The through holes 14 are formed respectively at both ends and at the center of the substrate 10. The through holes 14A and 14B are formed at the ends of the substrate 10 so as to notch the long side of the substrate 10 in a trapezoid pattern. The through hole 14C is formed at the center of the substrate 10 so as to notch the long side of the substrate 10 in a rectangular pattern having rounded corners.

The trapezoidal patterns of the through holes 14A and 14B are a similar reduced shape of the second region 120B of the front surface electrode 12 as shown in FIG. 4. The trapezoidal pattern is not necessarily a similar reduced shape, and may be any shape. However, a similar reduced shape can reduce the distance from the side surface of the through hole 14 to the outer periphery of the second region 120B of the front surface electrode 12, and can improve the mounting strength when the light-emitting device 1 according to Embodiment 1 is actually mounted on the mounting substrate 2.

The side surface of the through hole 14 is not necessarily perpendicular to the main surface of the substrate 10, and may be inclined.

The side surface electrode 15 is formed in a film along the side surface of the through hole 14. On the top surface side of the substrate 10, the side surface electrode 15 is connected to the front surface electrode 12 covering the through hole 14 in a lid shape. On the rear surface side of the substrate 10, the side surface electrode 15 is connected to the rear surface electrode 13. In this way, the front surface electrode 12 and the rear surface electrode 13 are connected via the side surface electrode 15.

From the above, in the light-emitting device according to Embodiment 1, misalignment of the light-emitting element 11, particularly in the short side direction, can be suppressed in mounting. The mounting strength can be sufficiently secured when the light-emitting device 1 according to Embodiment 1 is actually mounted on the mounting substrate 2.

Variations

The following is variations of the light-emitting device according to Embodiment 1.
(Variation of Front Surface Electrode 12)

Figure 7A:
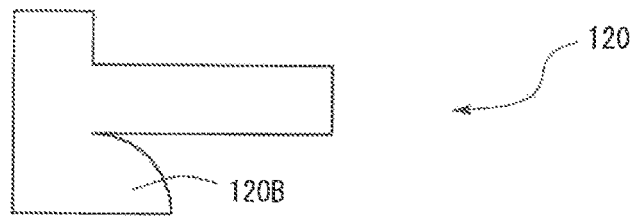
FIGS. 7A to 7C show variations of the pattern of the front surface electrode 12.
Figure 7B:
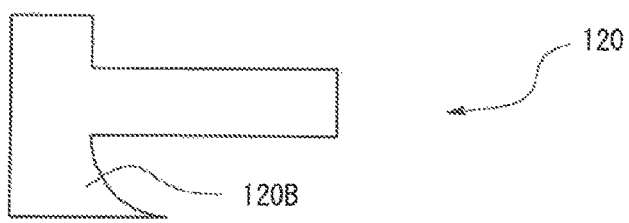
Figure 7C:
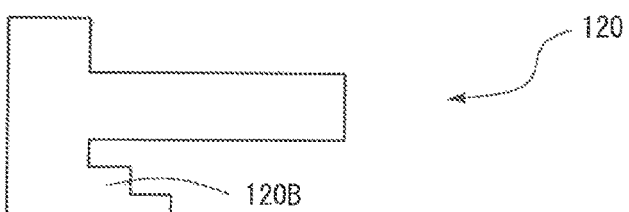

In Embodiment 1, the pattern of the second region 120B of the front surface electrode 12 is trapezoidal. However, the pattern of the second region 120B may be any shape as long as it is a shape where width in the longitudinal direction is increased toward the long side being notched by the through hole 14 of the long sides of the substrate 10. As long as the width is increased, the width may be continuously increased or gradually increased. For example, the straight oblique side of the trapezoid in Embodiment 1 may be arc-shaped as shown in FIGS. 7A and 7B, or stepped as shown in FIG. 7C. However, in terms of the formation accuracy of the front surface electrode 12, the oblique side of the trapezoid is preferably straight as in Embodiment 1. That is, the trapezoid as in Embodiment 1 is preferable, thereby accurately forming the front surface electrode 12.

Figure 9:
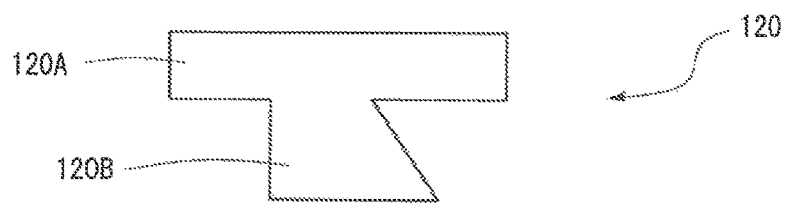
FIG. 9 shows a variation of the pattern of the front surface electrode 12.

The second region 120B is connected at the end on the short side of the substrate 10 of the first region 120A, however, may be connected at other region. For example, as shown in FIG. 9, the second region 120B may be connected at the center of the first region 120A.

Figure 8:
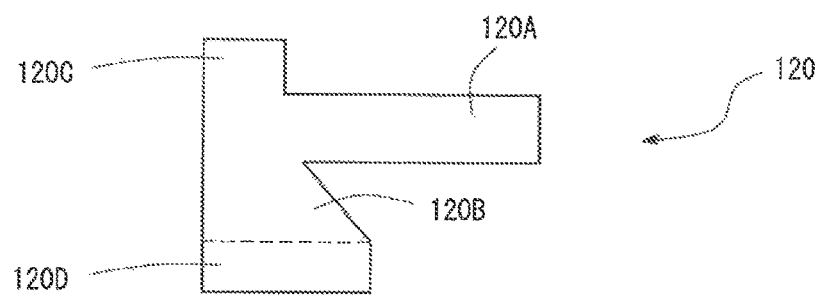
FIG. 8 shows a variation of the pattern of the front surface electrode 12.

As shown in FIG. 8, a fourth region 120D may be formed between the third region 120C and the long side on the through hole 14 side of the substrate 10. The fourth region 120D has a constant width in the longitudinal direction of the substrate 10.

Figure 10:
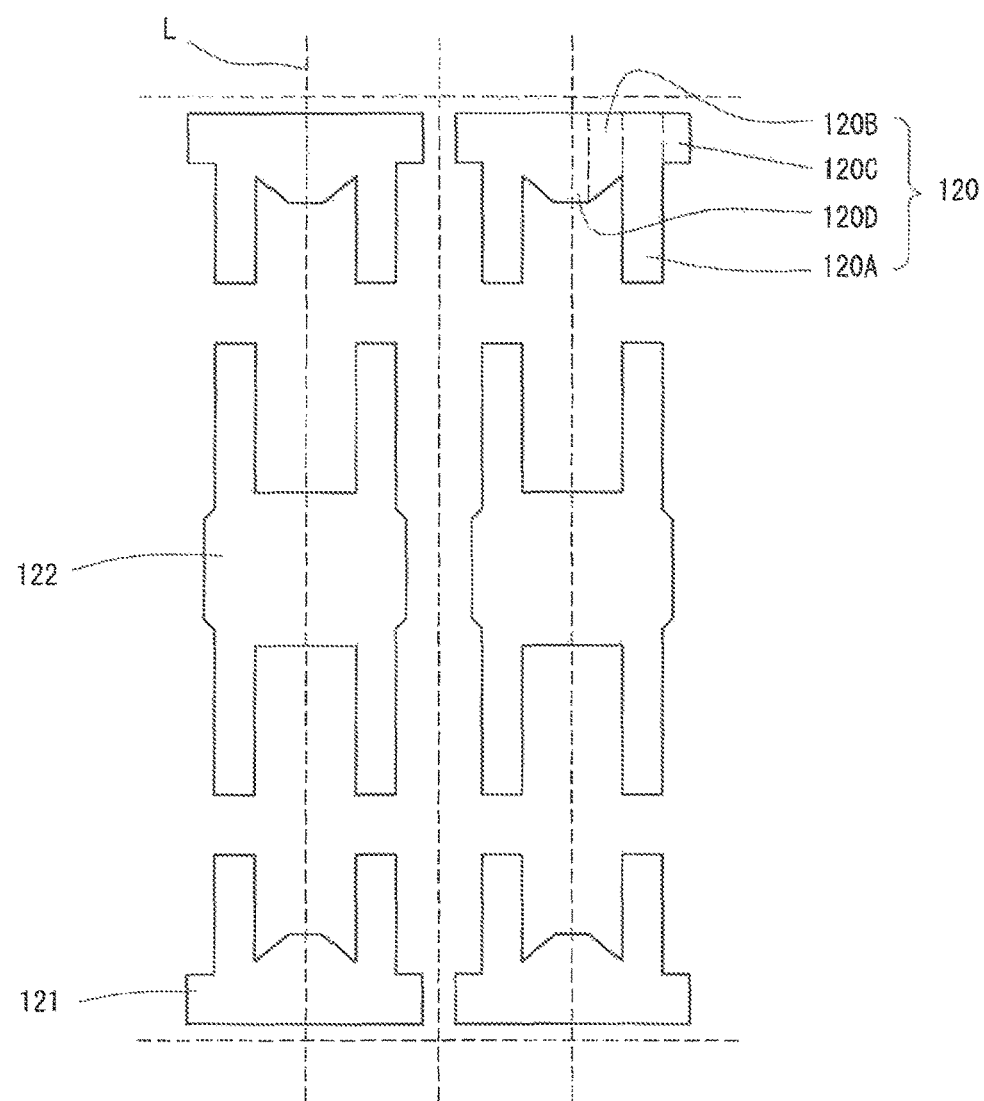
FIG. 10 shows a variation of the pattern of the front surface electrode 12.

The advantages of forming the fourth region 120D are as follows. When producing the light-emitting device according to Embodiment 1, the patterns of the front surface electrode 12 are efficiently formed on the front surface of the substrate 10 by forming the patterns of the front surface electrode 12 for each light-emitting device as shown in FIG. 10. The patterns of the front surface electrode 12 for one element are continued symmetrically with respect to the longitudinal direction as shown in FIG. 10, which is arranged as a unit in a lattice. Then, the substrate 10 is divided into each light-emitting device with the patterns of the front surface electrode 12. The dividing line L in the longitudinal direction passes through the fourth region 120D. The dividing line L is sometimes shifted when dividing the substrate 10. However, since the fourth region 120D has a constant width in the longitudinal direction, the width of the fourth region 120D is constant at the dividing line L even if the dividing line L is varied. As a result, variation in the mounting strength can be suppressed when the light-emitting device is actually mounted on the mounting substrate.

In Embodiment 1, a blue Group III nitride semiconductor light-emitting element is used as the light-emitting element 11, and the light emitted from the light-emitting device is converted into white by the phosphor sheet 16. However, the present invention is not limited to the embodiment. The light-emitting element 11 may be made of any semiconductor material other than Group III nitride semiconductor, and the phosphor being mixed in the phosphor sheet 16 may be made of a material having any light emission color. The phosphor sheet 16 for converting the light emission color may be provided as needed.

The light-emitting device according to Embodiment 1 has a structure in which two light-emitting elements 11 are mounted and connected in series. In the present invention, the number of the light-emitting elements 11 being mounted on the light-emitting device is not limited. The present invention is applicable even when one light-emitting element 11 is mounted or when three or more light-emitting elements 11 are mounted.

The light-emitting device of the present invention can be used as a light source for various devices, more specifically, for a backlight of a liquid crystal display.

What is claimed is:
1. A light-emitting device comprising:
a rectangular substrate;
a through hole being formed respectively at both sides of the substrate, and passing through the substrate;
a front surface electrode formed on a front surface of the substrate;
a rear surface electrode formed on a rear surface of the substrate;
a side surface electrode being formed on the side surfaces of the through hole, and connecting the front surface electrode and the rear surface electrode; and
a flip-chip type light-emitting element being formed on a surface of the substrate, and being connected to the front surface electrode,
wherein the light-emitting element is rectangular, two electrodes are separately formed each other on one main surface of the light-emitting element, and each of the electrodes has a long shape extending in a longitudinal direction of the rectangular light-emitting element;

wherein the through holes are formed so as to notch the long side of the substrate;

wherein the front surface electrodes are formed respectively at both sides of the substrate, each of the front surface electrodes has a first region having the same pattern as that of the long-shaped electrode of the light-emitting element or a pattern being extended in the longitudinal direction, and the longitudinal direction of the pattern being aligned with the longitudinal direction of the substrate; and a second region being connected to the first region, being formed in a lid shape so as to cover the top of the through hole, and having a shape where the width in the long side direction is increased toward the long side being notched by the through hole of the long sides of the substrate;

wherein the light-emitting elements are arranged and connected so that one electrode of the light-emitting element coincides in shape with the first region of the front surface electrode; and wherein the front surface electrode has a third region disposed on the front surface of the substrate, the third region being connected to the first region at a side opposite to a connection side of the second region.

2. The light-emitting device according to claim 1, wherein the third region has a rectangular shape.

3. The light-emitting device according to claim 2, wherein the second region has a trapezoidal shape.

4. The light-emitting device according to claim 2, wherein a contour line of a cross-sectional shape of the through hole parallel to the front surface of the substrate is parallel to a contour line of a cross-sectional shape of the second region parallel to the front surface of the substrate.

5. The light-emitting device according to claim 1, wherein the second region has a trapezoidal shape.

6. The light-emitting device according to claim 5, wherein a contour line of a cross-sectional shape of the through hole parallel to the front surface of the substrate is parallel to a contour line of a cross-sectional shape of the second region parallel to the front surface of the substrate.

7. The light-emitting device according to claim 1, wherein a contour line of a cross-sectional shape of the through hole parallel to the front surface of the substrate is parallel to a contour line of a cross-sectional shape of the second region parallel to the front surface of the substrate.

* * * * *